(12) United States Patent
Hunt et al.

(10) Patent No.: US 11,688,581 B2
(45) Date of Patent: Jun. 27, 2023

(54) APPARATUS FOR TRANSMISSION ELECTRON MICROSCOPY CATHODOLUMINESCENCE

(71) Applicant: Gatan, Inc., Pleasanton, CA (US)

(72) Inventors: John Andrew Hunt, Fremont, CA (US); Michael Bertilson, Dublin, CA (US)

(73) Assignee: GATAN, INC., Pleasanton, CA (US)

( * ) Notice: Subject to any disclaimer, the term of this patent is extended or adjusted under 35 U.S.C. 154(b) by 137 days.

(21) Appl. No.: 17/223,146

(22) Filed: Apr. 6, 2021

(65) Prior Publication Data
US 2021/0313141 A1 Oct. 7, 2021

Related U.S. Application Data

(60) Provisional application No. 63/006,287, filed on Apr. 7, 2020.

(51) Int. Cl.
*H01J 37/244* (2006.01)
*G01J 3/02* (2006.01)
(Continued)

(52) U.S. Cl.
CPC ............. *H01J 37/244* (2013.01); *G01J 3/021* (2013.01); *G01J 3/0216* (2013.01);
(Continued)

(58) Field of Classification Search
CPC ...... H01J 37/244; H01J 37/226; H01J 37/285; H01J 2237/2445; H01J 2237/262;
(Continued)

(56) References Cited

U.S. PATENT DOCUMENTS

| 4,929,041 A * | 5/1990 | Vahala | H01J 37/244 |
| | | | 385/116 |
| 8,912,509 B2 * | 12/2014 | Kociak | H01J 37/261 |
| | | | 250/458.1 |

(Continued)

OTHER PUBLICATIONS

International Preliminary Report on Patentability dated Oct. 6, 2022 for PCT International Application No. PCT/US2021/025860.
(Continued)

*Primary Examiner* — David A Vanore
(74) *Attorney, Agent, or Firm* — Volpe Koenig

(57) ABSTRACT

Apparatuses for collection of upstream and downstream transmission electron microscopy (TEM) cathodoluminescence (CL) emitted from a sample exposed to an electron beam are described. A first fiber optic cable carries first CL light emitted from a first TEM sample surface, into a spectrograph. A second fiber optic cable carries second CL light emitted from a second TEM sample surface into the spectrograph. The first and second fiber optic cables are positioned such that the spectrograph produces a first light spectrum for the first fiber optic cable and a separate light spectrum for the second fiber optic cable. The described embodiments allow collection of TEM CL data in a manner that allows analyzing upstream and downstream TEM CL signals separately and simultaneously with an imaging spectrograph.

11 Claims, 6 Drawing Sheets

(51) Int. Cl.
*G01J 3/44* (2006.01)
*G01N 21/66* (2006.01)
*H01J 37/22* (2006.01)
*H01J 37/285* (2006.01)

(52) U.S. Cl.
CPC ........... *G01J 3/0218* (2013.01); *G01J 3/4406* (2013.01); *G01N 21/66* (2013.01); *H01J 37/226* (2013.01); *H01J 37/285* (2013.01); H01J 2237/2445 (2013.01); H01J 2237/262 (2013.01); H01J 2237/2855 (2013.01)

(58) Field of Classification Search
CPC ............. H01J 2237/2855; H01J 37/26; H01J 2237/2808; H01J 37/228; G01J 3/021; G01J 3/0216; G01J 3/0218; G01J 3/4406; G01N 21/66
See application file for complete search history.

(56) References Cited

U.S. PATENT DOCUMENTS

| | | | | |
|---|---|---|---|---|
| 9,431,211 | B2* | 8/2016 | Sharma | H01J 37/226 |
| 9,966,220 | B2* | 5/2018 | Trevor | H01J 37/05 |
| 10,157,726 | B2* | 12/2018 | Kociak | H01J 37/244 |
| 10,453,647 | B2* | 10/2019 | Mohammadi-Gheidari | H01J 37/243 |
| 10,707,051 | B2* | 7/2020 | Hunt | H01J 37/228 |
| 10,943,764 | B2* | 3/2021 | Bertilson | H01J 37/226 |
| 11,024,484 | B2* | 6/2021 | James | H01J 37/05 |
| 11,205,559 | B2* | 12/2021 | Hunt | H01J 37/244 |
| 11,367,539 | B2* | 6/2022 | Zheng | G21K 1/006 |
| 2005/0162649 | A1 | 7/2005 | Kryszczynski et al. | |
| 2008/0043232 | A1 | 2/2008 | Wang et al. | |
| 2012/0138792 | A1 | 6/2012 | Danilov et al. | |
| 2013/0141803 | A1 | 6/2013 | Galloway et al. | |

OTHER PUBLICATIONS

International Search Report dated Jul. 29, 2021 for PCT International Application No. PCT/US2021/025860.

* cited by examiner

APPARATUS FOR TRANSMISSION ELECTRON MICROSCOPY CATHODOLUMINESCENCE

RELATED APPLICATION

This application claims priority under 35 U.S.C. § 119 based on U.S. Provisional Application No. 63/006,287 filed Apr. 7, 2020 and entitled "Apparatus for Transmission Electron Microscopy Cathodoluminescence," the contents of which are hereby incorporated herein by reference in their entirety.

BACKGROUND

When a high-energy charged particle such as an electron or ion beam strikes a sample, photons can be emitted depending on the sample material. This phenomenon is known as cathodoluminescence (CL). The collection and detection of these photons in the wavelength range from ultraviolet (UV) through visible to infrared (IR), can provide a wealth of information about the sample under investigation. CL is typically examined with the sample in an electron microscope by directing the CL-emitted photons to, for example a light sensor, image array or spectroscopy equipment, any or all of which may be located outside the electron microscope beam column. The inside of the electron microscope beam column is kept at low pressures so the electrons can travel to the sample without significant scattering by gas in the electron beam column. After the light is collected, it can be transmitted from the low-pressure environment, through an optical window, and into instruments that analyze the CL light.

A common way to collect photons emitted via CL is via a collection-mirror located on axis with the electron beam (e-beam) and either above (as is typical with bulk samples examined in the scanning electron microscope (SEM)), below the sample or both above and below the sample (as is typical for transmission electron microscopes (TEM)). It is typical for collection-mirrors to have a hole to allow the e-beam to pass through the mirror unobstructed.

Detailed analysis of spectral information of the CL signal requires coupling the CL light from the collection-mirrors to a light spectrometer which typically is used to produce a one-dimensional plot of light intensity as a function of light wavelength. Some light spectrometers, herein termed a "spectrograph" but can also be called other terms such as "imaging spectrometer" or "imaging spectrograph", have the added capability of producing a two dimensional image of light entering the spectrograph entrance plane, where the wavelength of the light is mapped along one dimension and the position along the entrance plane at which the light entered the spectrograph maps to the other dimension.

In the TEM, electron energies (30-300 keV) are significantly higher than in the scanning electron microscope (0.5-30 keV). Samples in TEMs are examined where they are thin enough for the electron beam to be substantially transmitted through the sample, and CL light can emerge through both the top (electron incident or upstream surface) and the bottom (downstream surface) of the sample. TEM CL sample holders have been developed that collect this light from collection mirrors placed above and below the sample. Because the TEM sample environment places tight space requirements for the sample and the collection mirrors, CL light can be separately conveyed from the collection mirrors to outside the TEM environment via separate fiber optics. A light spectrometer can be used to analyze the combined light from the fiber optics.

The higher energy electrons used in TEMs are more prone to generating braking radiation, also known as Cherenkov radiation, due to the electrons travelling through the sample faster than the phase velocity of light in the sample medium. This Cherenkov radiation is scattered in the downstream direction and thus will be substantially collected by a collection mirror below the sample, but much less so by a collection mirror above the sample. A first-order approximation of the Cherenkov signal can be made by subtracting a multiple of the signal from the top-mirror from the signal from the bottom-mirror. Analysis of the Cherenkov radiation can give information about the sample index of refraction and can be used to improve the dielectric response characterization performed simultaneously by electron energy-loss spectrometry (EELS).

Some samples, for example photonic devices or layered materials, may generate light distributions that differ significantly in the downstream and upstream directions due to orientation effects not related to Cherenkov radiation. An estimate of these differences can be made by subtracting a multiple of the signal from the top-mirror from the signal from the bottom-mirror.

DETAILED DESCRIPTION OF PREFERRED EMBODIMENTS

Those skilled in the art will recognize other detailed designs and methods that can be developed employing the teachings of the present invention. The examples provided here are illustrative and do not limit the scope of the invention, which is defined by the attached claims. The following detailed description refers to the accompanying drawings. The same reference numbers in different drawings may identify the same or similar elements.

Figure 1:
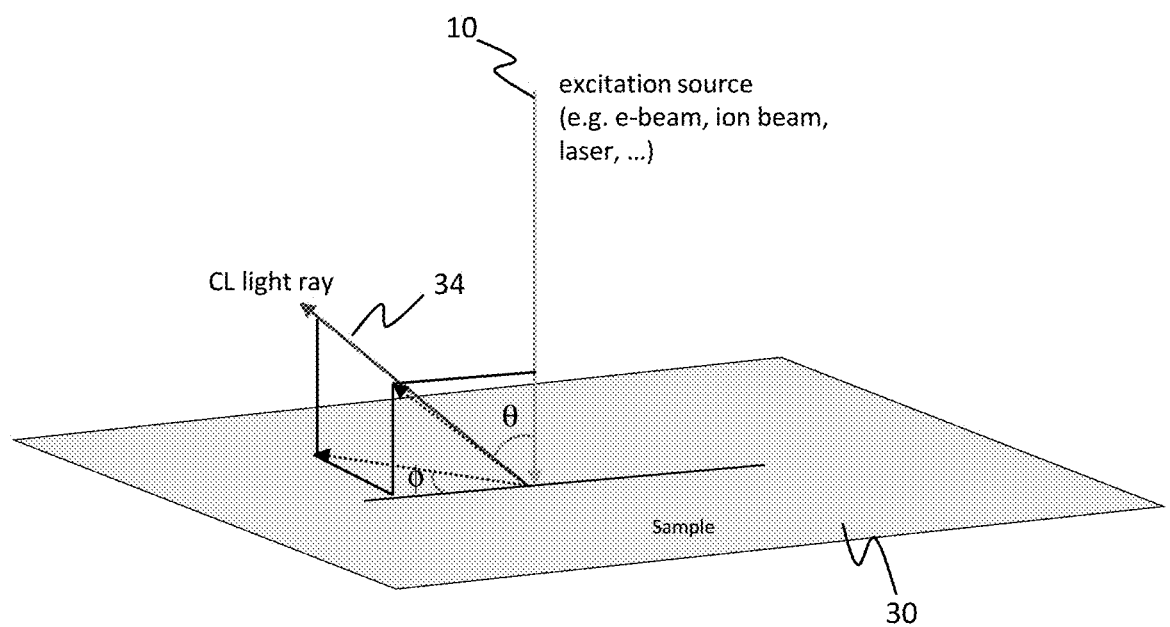
FIG. 1 is a diagram showing the emission of cathodoluminescence light (CL) in a sample resulting from an excitation source.

As shown in FIG. 1, CL light may be emitted from a sample 30 when an excitation beam source, such as electron beam 10, ion beam, or photon beam, transfers energy to a sample. The emitted CL light photons 34 may have a wavelength and angle with respect to the excitation source beam, θ (XY plane), φ (with respect to Z axis) which is characteristic of elemental, chemical, or dielectric properties of the analyzed region of the sample 10. Substantial information on these properties can be obtained by analysis of emitted photon intensity (I) distributions of wavelength I(λ), angle I(θ,φ) or wavelength-angle I(λ,θ,φ). Further information can be obtained by studying the optical polarization of these distributions.

Figure 2:
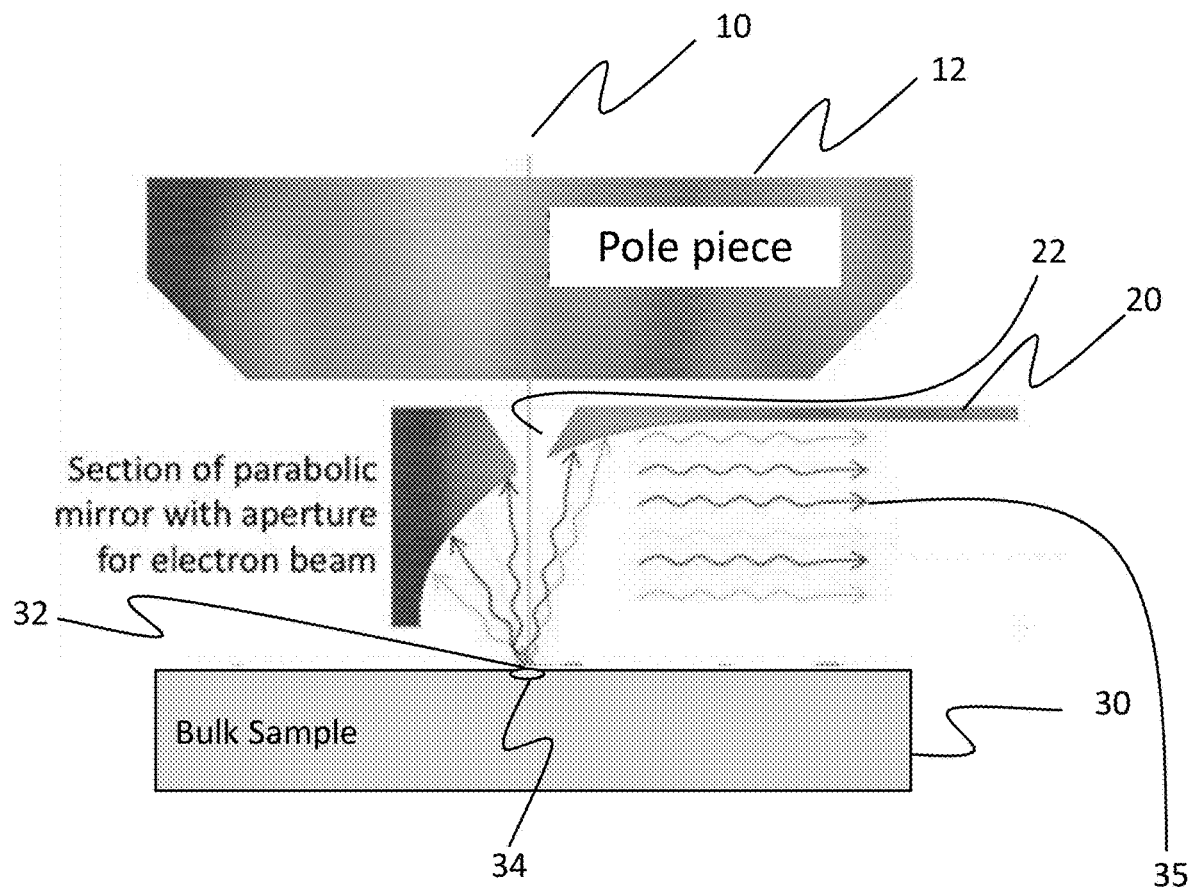
FIG. 2 is a diagram of an apparatus for collection of cathodoluminescence light in an electron microscope from a bulk specimen.

FIG. 2 shows an electron beam (e-beam) 10 that exits a pole piece 12 of an electron microscope (not shown in full) and is directed to a bulk sample 30. At the point 32 where the e-beam 10 strikes the sample 30, cathodoluminescence (CL) light 34 may be generated. A collection-mirror, 20 is provided to reflect the CL light 34 to detectors (not shown), which may be located outside of the electron microscope. The collection-mirror 20 will typically have a hole or opening 22 to allow the e-beam 10 to pass through, since the mirror may be made of a material (e.g. diamond polished aluminum) that would otherwise obstruct the e-beam. CL light 34 collected by collection-mirror 20, when properly focused on the sample 30, produces a light-pattern 35 that is collimated along the exit optic axis (not labeled) of mirror 20. In a typical CL instrument, the light collected by collection-mirror 20 is sent to one or more CL analysis instruments.

Figure 3:
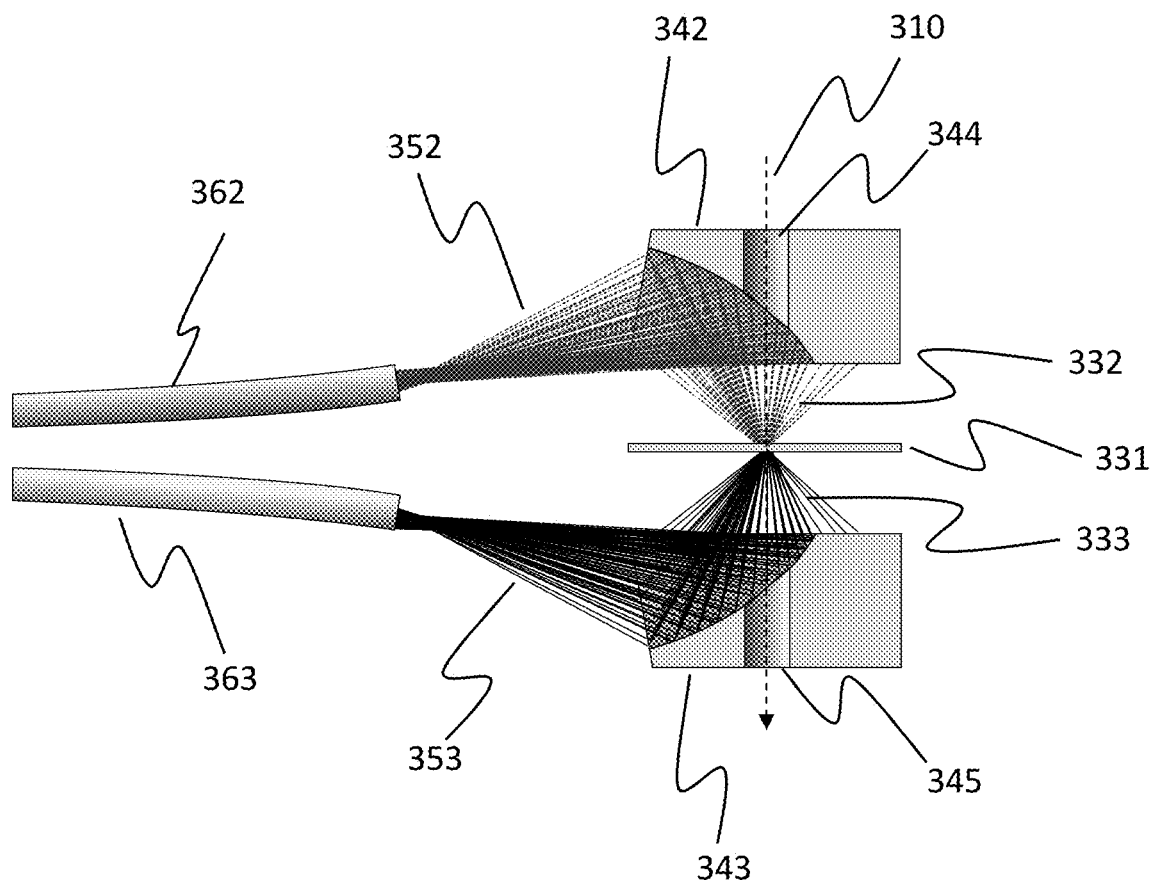
FIG. 3 is a drawing showing the emission of CL from top and bottom surfaces of a TEM sample, reflecting off upstream (top) and downstream (bottom) collection-mirrors and entering top and bottom fiber optics.

Consistent with an embodiment of the invention, FIG. 3 shows a TEM e-beam 310 entering upper-collection-mirror-hole 344, traveling through electron-transparent-sample 331. E-beam 310 may generate upstream-CL-light 332 that travels through the surface of sample 331 from where the incident e-beam 310 enters, or downstream-CL-light 333 that travels through the surface of sample 331 opposite to where incident e-beam 310 enters. After traveling through sample 331, a substantial fraction of e-beam 310 continues through lower-collection-mirror-hole 345 where it may be further analyzed in the transmission electron microscope (not shown) with techniques such as TEM imaging, TEM diffraction, or electron energy-loss spectroscopy (EELS).

TEM CL systems have been developed that collect CL light from collection mirrors placed both above (upstream) and below (downstream) the sample. The collection mirrors 342 and 343 may be part of the TEM sample holder or separate from the sample holder. The TEM sample environment places tight space requirements for the sample 331 and the collection mirrors 342 and 343. CL light from the collection mirrors 342 and 343 can be brought to outside the TEM environment via separate fiber optics. In practice, collection mirrors 342 and 343 do not collect all of the light emitted from sample 331. Collection mirror 342 will transmit only a portion 352 of upstream-CL-light 332 into upstream-fiber-optic 362. Collection mirror 343 will transmit only a portion 353 of downstream-CL-light 333 into downstream-fiber-optic 363.

Figure 4:
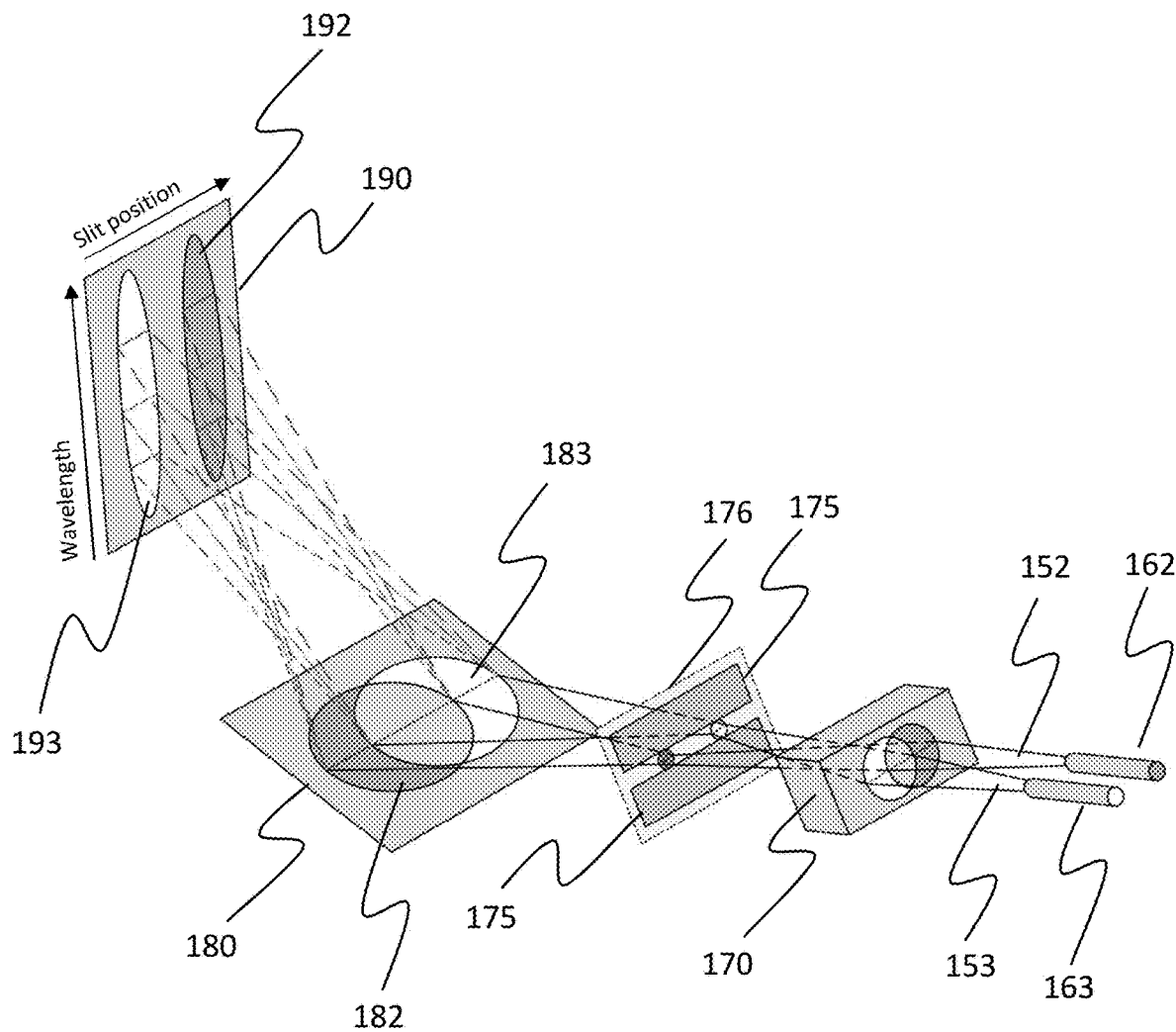
FIG. 4 is a drawing of an embodiment of an aspect of the invention for simultaneous imaging of separate light signals from upstream and downstream CL collection mirrors.

An aspect of the invention provides for simultaneous and separate spectral measurement of light collected 352, 353 from the upstream 342 and downstream 343 collection mirrors in a TEM CL system. FIG. 4 is a schematic drawing of an embodiment of an aspect of the invention depicting a spectrograph creating two separate spectra 192 and 193 from the light contained in two separate fiber-optics 162 and 163. The signal from upstream-fiber-optic 362 to spectrograph-input-fiber-optic 162 can be coupled via one or more fiber-optic cables (not shown) that can easily be connected and reconnected. Likewise, the signal from downstream-fiber-optic 363 to spectrograph-input-fiber-optic 163 can be coupled via one or more fiber-optic cables (not shown) that can easily be connected and reconnected.

Fiber optics 162 and 163 can have a numerical aperture and core size that is unlikely to be optimal for direct coupling into the spectrograph, so coupling optics 170 can be used to correct the mismatch between the numerical aperture of the fibers 162, 163 and the numerical aperture of the spectrograph. In an alternate embodiment, coupling optics are not used and instead fiber optics 162 and 163 can be directly placed near the entrance plane 176 of the spectrograph.

Fiber optic 162 is shown carrying light-signal 152 which, is projected through coupling optics 170 through entrance plane 176 of the spectrograph. The portion of light-signal 152 not blocked by entrance-slit 175 illuminates a region 182 on diffraction-grating 180. Diffraction-grating 180 creates a dispersion in wavelength of the light illuminating region 182 which is focused on area 192 of two-dimensional camera 190.

Likewise, fiber optic 163 is shown carrying light-signal 153, which is projected through coupling optics 170 through entrance-plane 176 of the spectrograph. Coupling optics 170 can include one or more lenses or mirrors and may compensate for a mismatch in numerical aperture between the fiber optic 163 and the spectrograph. The portion of light-signal 153 not blocked by entrance-slit 175 illuminates a region 183 on diffraction-grating 180. Diffraction-grating 180 creates a dispersion in wavelength of the light which is focused on area 193 of two-dimensional camera 190.

In an embodiment of an aspect of the invention, the diffraction-grating 180 is in the infinity-space of the spectrograph and regions 182 and 183 may partially or completely overlap without causing signal mixing at camera 190.

Figure 5:
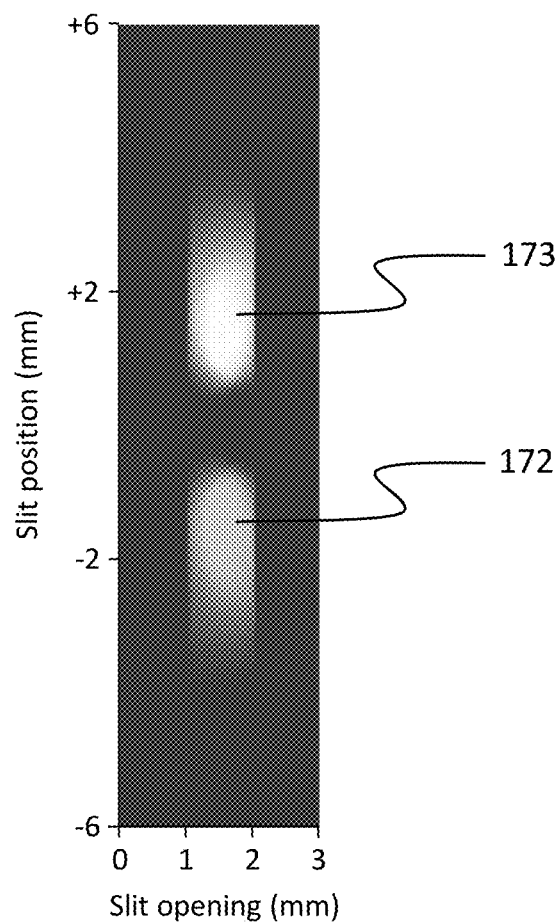
FIG. 5 is a simulated image, based on of an embodiment of an aspect of the invention, showing the distribution of light from two separated fiber optics at the plane of the entrance slit of an imaging spectrograph.

FIG. 5 shows a simulated image of light bundle 172, based on an embodiment of an aspect of the invention, from light signal 152 (FIG. 4) as it passes through the plane of entrance-slit 175. Likewise, FIG. 5 shows the simulated image of light-bundle 173 from light signal 153 (FIG. 4) as it passes through the plane of entrance-slit 175. In an exemplary implementation, light bundles 172 and 173 are well separated to prevent signal mixing at camera 190.

Figure 6A:
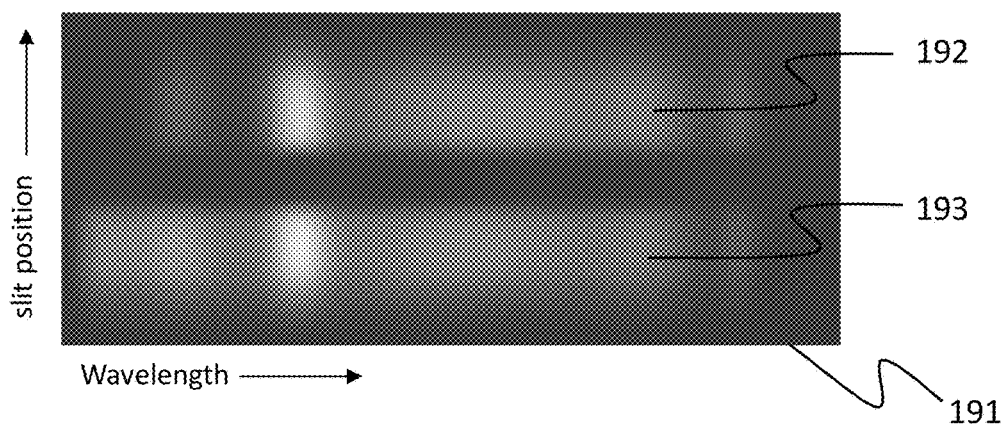
FIG. 6A illustrates a simulated image, based on of an embodiment of an aspect of the invention, showing separated spectra at the plane of the spectrograph camera.

FIG. 6a shows a simulated image 191 from camera 190 (FIG. 4), based on an embodiment of an aspect of the invention. Image area 192 shows a simulated image of light signal 152 (FIG. 4) after being dispersed by diffraction-grating 180 and focused on camera 190. Likewise, image area 193 shows a simulated image of light signal 153 (FIG. 4) after being dispersed by diffraction-grating 180 and focused on camera 190. Image areas 192 and 193 are shown to be well separated. Simulated image 191 is representative of an image projected onto a two-dimensional pixelated device, such as an image sensor of camera 190, which may be organized into a plurality of horizontal rows of pixels. Spectra 192 and 193 each comprise a plurality of horizontal rows of the pixelated device.

Camera 190 may be a charge coupled device imaging sensor or other solid state two-dimensional imaging comprising pixels arranged in an XY plane. Spectra 192, 193 may also be projected simultaneously onto more than one imaging device, for example a CCD sensor and a photosensitized plate.

Figure 6B:
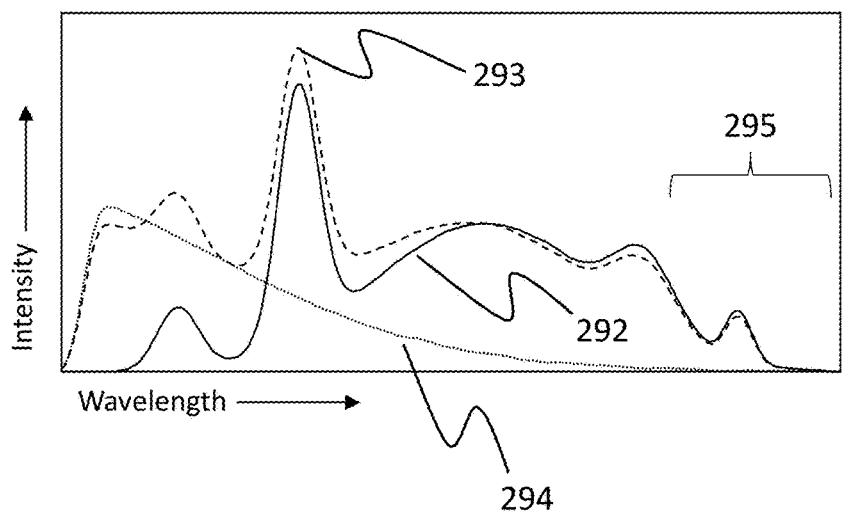
FIG. 6B illustrates intensity versus wavelength spectra and a difference spectrum in accordance with an exemplary implementation.

Based on an embodiment of an aspect of the invention, FIG. 6b shows one-dimensional, intensity-versus-wavelength spectrum 292, which can be calculated by summing together the intensity of pixels in each image row in image area 192. FIG. 6b also shows one-dimensional, intensity-versus-wavelength spectrum 293, which can be calculated by summing together the intensity of pixels in each image row in image area 193. In an exemplary implementation, a system controller (not shown) may control output to a display, such as the displays illustrated in FIGS. 6a and 6b. For example, the system controller may include a processor, microprocessor or processing logic that may interpret and execute instructions to perform various tasks, such as generate intensity-versus-wavelength spectra 292 and 293, calculate difference-spectrum 294 described below, etc. The system controller may be implemented in hardware, software or a combination of hardware and software and may perform other tasks to control operations described herein. In some implementations, the system controller may be implemented in an electron microscope. In other implementations, the system controller may be implemented externally with respect to an electron microscope, such as implemented in the optical system described herein.

Based on an embodiment of an aspect of the invention, and with reference to FIG. 6b, spectrum 292 can be produced from light collected from upstream-mirror 342 (FIG. 3), and spectrum 293 can be produced from light collected from downstream-mirror 343. An advantage of recording upstream-CL-spectrum 292 and downstream-CL-spectrum 293 separately and simultaneously is that their difference-spectrum 294 can be calculated by, for example, the system controller/processing device, and displayed in real time. In an embodiment of an aspect of the invention, difference-spectrum 294 equals downstream-CL-spectrum 293 minus a constant multiplied by upstream-CL-spectrum 292. As a first approximation, the constant can be set to unity, but it may be adjusted to account for differences in collection efficiency or differences in transmission efficiency through the sample or the fiber-optics. In cases where Cherenkov radiation is expected to be the main difference between downstream-CL-spectrum 293 and upstream-CL-spectrum 292, the constant can be set to the integral of downstream-CL-spectrum 293 in the red/IR region 295 divided by the integral of upstream-CL-spectrum 292 in the red/IR region 295.

In another embodiment of an aspect of the invention, there may be more than a single CL collection mirror above the sample and more than a single CL collection mirror below the sample. Accordingly, there would be more than a single fiber optic coupling upstream CL light to a spectrometer and/or more than a single fiber optic coupling downstream CL light to the spectrometer. This would result in there being more than one spectrum projected onto an imaging device for the upstream CL light and/or more than one spectrum projected onto the imaging device for the downstream CL light.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An apparatus for collection and analysis of cathodoluminescence (CL) light produced by a transmission electron microscopy (TEM) sample in an electron microscope comprising:
    a spectrograph having an entrance plane, said spectrograph being configured to produce a light spectrum comprising a two-dimensional image of light intensity where one axis of said image corresponds to light wavelength and the other axis corresponds to a spatial coordinate of the light entering the entrance plane of said spectrograph;
    a first fiber-optic-cable having a first receiving end arranged to carry first CL light emitted from a first TEM sample surface, and a first transmitting end arranged to couple said first CL light into said spectrograph;
    a second fiber-optic-cable having a second receiving end arranged to carry second CL light emitted from a second TEM sample surface where the transmitted TEM electron beam exits, and a second transmitting end arranged to couple said second CL light into said spectrograph;
    wherein said first and second transmitting ends are positioned such that said spectrograph produces a first light spectrum for said first fiber-optic-cable and a separate light spectrum for said second fiber-optic-cable.

2. The apparatus of claim 1, further comprising coupling optics located between said spectrograph and said first and second fiber-optic-cables, the coupling optics being configured to reduce a mismatch of numerical aperture between said spectrograph and said first and second fiber-optic-cables.

3. The apparatus of claim 1 further comprising a processor configured to measure a difference between said first and second light spectra.

4. The apparatus of claim 3 further comprising a display and where said measured difference between said first and second light spectra is output to the display in real time.

5. The apparatus of claim 1, further comprising a single image detector and wherein said first and second light spectra are projected onto the single image detector to form separate first and second spectra in a single image.

6. An apparatus for collection and analysis of cathodoluminescence (CL) light produced by a transmission electron microscopy (TEM) sample in an electron microscope comprising:
    a first collection mirror positioned to collect CL light emitted by the sample on a sample surface directly exposed to entry of an electron beam;
    a second collection mirror positioned to collect CL light emitted by the sample on a sample surface wherein said electron beam exits the sample
    a spectrograph having an entrance plane, said spectrograph being configured to produce a light spectrum comprising a two-dimensional image of light intensity where one axis of said image corresponds to light wavelength and the other axis corresponds to a spatial coordinate of the light entering the entrance plane of said spectrograph;
    a first fiber-optic-cable having a first receiving end arranged to carry said first CL light reflected from said sample by said first collection mirror, and a first transmitting end arranged to couple said first CL light into said spectrograph;
    a second fiber-optic-cable having a second receiving end arranged to carry said second CL light reflected from said sample by said second collection mirror, and a second transmitting end arranged to couple said second CL light into said spectrograph;

wherein said first and second transmitting ends are positioned such that said spectrograph produces a first light spectrum for said first fiber-optic-cable and a separate light spectrum for said second fiber-optic-cable.

7. The apparatus of claim 6, further comprising a third collection mirror positioned to collect third CL light emitted by the sample;

a third fiber-optic-cable having a third receiving end arranged to carry said third CL light reflected from said sample by said second collection mirror, and a third transmitting end arranged to couple said third CL light into said spectrograph;

wherein said first fiber optic and second fiber optic transmitting ends are positioned such that said spectrograph produces a first light spectrum for said first fiber-optic-cable, a separate light spectrum for said second fiber-optic-cable, and a separate light spectrum for said third fiber-optic-cable.

8. The apparatus of claim 6, further comprising coupling optics located between said spectrograph and said first and second fiber-optic-cables, the coupling optics being configured to reduce a mismatch of numerical aperture between said spectrograph and said first and second fiber-optic-cables.

9. The apparatus of claim 6 further comprising a processor configured to measure a difference between said first and second light spectra.

10. The apparatus of claim 9 further comprising a display and where said measured difference between said first and second light spectra is output to the display in real time.

11. The apparatus of claim 6, further comprising a single image detector and wherein said first and second light spectra are projected onto the single image detector to form separate first and second spectra in a single image.

\* \* \* \* \*